(12) United States Patent
Sharma et al.

(10) Patent No.: US 9,733,854 B2
(45) Date of Patent: Aug. 15, 2017

(54) DYNAMIC ADAPTIVE COMPRESSION IN NETWORK STORAGE DEVICE

(71) Applicant: Nimble Storage, Inc., San Jose, CA (US)

(72) Inventors: Rajat Sharma, San Jose, CA (US); Umesh Maheshwari, San Jose, CA (US); Sandeep Karmarkar, San Jose, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 117 days.

(21) Appl. No.: 14/927,824

(22) Filed: Oct. 30, 2015

(65) Prior Publication Data

US 2017/0123704 A1    May 4, 2017

(51) Int. Cl.
| | |
|---|---|
| *G06F 12/00* | (2006.01) |
| *G06F 3/06* | (2006.01) |
| *H03M 7/30* | (2006.01) |
| *G06F 13/00* | (2006.01) |
| *G06F 13/28* | (2006.01) |

(52) U.S. Cl.
CPC ............ *G06F 3/0626* (2013.01); *G06F 3/065* (2013.01); *G06F 3/0619* (2013.01); *G06F 3/0685* (2013.01); *H03M 7/30* (2013.01)

(58) Field of Classification Search
CPC ...... G06F 3/0626; G06F 3/065; G06F 3/0619; G06F 3/0685; H03M 7/30
See application file for complete search history.

(56) References Cited

U.S. PATENT DOCUMENTS

| | | | | |
|---|---|---|---|---|
| 5,276,898 A | * | 1/1994 | Kiel | ..................... G06F 11/3409 358/1.9 |
| 8,275,909 B1 | * | 9/2012 | Rothstein | ................ H03M 7/30 375/240 |
| 9,385,749 B1 | * | 7/2016 | Nam | ..................... H03M 7/6082 |
| 2015/0095553 A1 | * | 4/2015 | Walls | ..................... G06F 3/0613 711/103 |

* cited by examiner

*Primary Examiner* — Mark Giardino, Jr.
(74) *Attorney, Agent, or Firm* — Martine Penilla Group, LLP

(57) ABSTRACT

Methods, systems, and computer programs are presented for dynamic adaptive compression in a storage device. One method includes operations for setting a percentage factor for utilizing a first and a second compression algorithms, and for receiving incoming blocks in the memory of the storage device. The incoming blocks are compressed before being sent to permanent storage, where a portion of the incoming blocks are compressed with the first compression algorithm based on the percentage factor, and the remainder is compressed with the second compression algorithm. Further, the method includes determining that a processor utilization rate, of a processor in the storage device, is below a first predetermined threshold, and decreasing, in response to the determining, the percentage factor to decrease the portion of the incoming blocks that are compressed with the first compression algorithm, while the remainder of the incoming blocks is compressed with the second compression algorithm.

20 Claims, 8 Drawing Sheets

DYNAMIC ADAPTIVE COMPRESSION IN NETWORK STORAGE DEVICE

BACKGROUND

1. Field of the Invention

The present embodiments relates to methods, systems, and programs for the management of processor utilization.

2. Description of the Related Art

Network storage, also referred to as network storage systems or storage systems, is computer data storage connected to a computer network providing data access to heterogeneous clients. Typically network storage systems process a large amount of Input/Output (IO) requests, and high availability, speed, and reliability are desirable characteristics of network storage.

Some—or all—of the data stored in the network storage device is compressed before being transferred to permanent storage in order to better utilize resources. However, compressing data consumes processor cycles when the data is compressed at the time that the data arrives at the storage device.

If too many processing cycles are used to compress the data, the input/output processing performance may be affected, and the excess cycles used in compressing the data may affect the overall performance of the network storage device.

It is in this context that embodiments arise.

SUMMARY

Methods, devices, systems, and computer programs are presented for dynamic adaptive compression. It should be appreciated that the present embodiments can be implemented in numerous ways, such as a method, an apparatus, a system, a device, or a computer program on a computer readable medium. Several embodiments are described below.

A system of one or more computers can be configured to perform particular operations or actions by virtue of having software, firmware, hardware, or a combination of them installed on the system that in operation cause the system to perform the actions. One or more computer programs can be configured to perform particular operations by virtue of including instructions that, when executed by data processing apparatus, cause the apparatus to perform the actions. One general aspect includes a method including an operation for setting a percentage factor for utilizing a first compression algorithm and a second compression algorithm in a storage device. The method also includes receiving incoming blocks in a memory of the storage device. The method also includes compressing the incoming blocks before sending the compressed incoming blocks to permanent storage in the storage device, where a portion of the incoming blocks are compressed with the first compression algorithm based on the percentage factor, and a remainder of the incoming blocks is compressed with the second compression algorithm. The method also includes determining that a processor utilization rate, of a processor in the storage device, is below a first predetermined threshold. The method also includes decreasing, in response to the determining, the percentage factor to decrease the portion of the incoming blocks that are compressed with the first compression algorithm while the remainder of the incoming blocks is compressed with the second compression algorithm. Other embodiments of this aspect include corresponding computer systems, apparatus, and computer programs recorded on one or more computer storage devices, each configured to perform the actions of the methods.

Implementations may include one or more of the following features. The method as recited where a number of incoming blocks compressed with the first compression algorithm over a predetermined period of time is equal to the percentage factor times a total number of incoming blocks compressed over the predetermined period of time, where a number of incoming blocks compressed with the second compression algorithm over the predetermined period of time is equal to the total number of incoming blocks compressed over the predetermined period of time minus the number of incoming blocks compressed with the first compression algorithm over the predetermined period of time. The method as recited, where the percentage factor is adjustable to be any percentage value between zero percent and one hundred percent. The method as recited further including re-determining, after decreasing the percentage factor, that the processor utilization rate is still below the first predetermined threshold. The method may also include continue decreasing, in response to the re-determining, the percentage factor while the percentage factor is greater than zero. The method as recited further including determining that the processor utilization rate is above a second predetermined threshold. The method may also include increasing the percentage factor when the processor utilization rate is above the second predetermined threshold. The method as recited where the first algorithm performs compression faster than the second algorithm, and where the second algorithm is more effective at compressing than the first algorithm. The method as recited where the processor is in a controller in the storage device, where the processor is utilized for processing the incoming blocks received at the storage device. The method as recited further including grouping a plurality of compressed blocks into a segment. The method may also include storing the segment in the permanent storage. The method as recited where the incoming blocks belong to one or more volumes, where blocks within a volume are compressible utilizing the first algorithm and are compressible utilizing the second algorithm.

One general aspect includes a storage device including a memory for storing incoming blocks received at a storage device, permanent storage, and a processor. The processor is configured to set a percentage factor for utilizing a first compression algorithm and a second compression algorithm in the storage device, where the incoming blocks are compressed before the compressed incoming blocks are sent to the permanent storage, where a portion of the incoming blocks are compressed with the first compression algorithm based on the percentage factor, and a remainder of the incoming blocks is compressed with the second compression algorithm. The processor is configured to decrease, when a processor utilization rate of the processor is below a first predetermined threshold, the percentage factor to decrease the portion of the incoming blocks that are compressed with the first compression algorithm while the remainder of the incoming blocks is compressed with the second compression algorithm.

One general aspect includes a non-transitory computer-readable storage medium storing a computer program for processing data in a storage device, the computer-readable storage medium including program instructions for setting a percentage factor for utilizing a first compression algorithm and a second compression algorithm in a storage device. The storage medium also includes program instructions for receiving incoming blocks in a memory of the storage device. The storage medium also includes program instructions for compressing the incoming blocks before sending the compressed incoming blocks to permanent storage in the storage device, where a portion of the incoming blocks are compressed with the first compression algorithm based on the percentage factor, and a remainder of the incoming blocks is compressed with the second compression algorithm. The storage medium also includes program instructions for determining that a processor utilization rate, of a processor in the storage device, is below a first predetermined threshold. The storage medium also includes program instructions for decreasing, in response to the determining, the percentage factor to decrease the portion of the incoming blocks that are compressed with the first compression algorithm while the remainder of the incoming blocks is compressed with the second compression algorithm.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The processing of incoming blocks in a storage device includes compressing the incoming blocks before being sent to disk. A plurality of different compression algorithms is available, where each compression algorithm has a different speed and a different compression ratio. Sometimes, the system switches to a different compression algorithm in order to employ the compression algorithm that is fastest or that performs better compression, depending on the situation. For example, when CPU cycles are available, a better compression algorithm is selected (e.g., it compresses data better), although the algorithm may be slower.

Sometimes, oscillating cycles may repeat because, in the presence of free CPU cycles, a slower algorithm is selected, which causes the CPU to be overwhelmed; then the system switches back to the faster algorithm in order to release pressure on the system, and the switches may continue back and forth. This oscillating change may repeat over time, creating an undesired instability effect.

Embodiments provide for the utilization of one or more compression algorithms simultaneously, where a certain percentage of blocks may be compressed with a first algorithm while the other blocks are processed with a second algorithm. The proportion of use of one algorithm versus the other may change gradually over time, depending on several factors, such as the CPU utilization ratio. For example, if CPU cycles are available, the percentage of blocks processed with a slower algorithm is increased, but if there is pressure detected on the CPU, the percentage of blocks processed with a slower algorithm will be decreased. Also, as long as there are CPU cycles available, the percentage use of the slower algorithm will be increased, until the CPU utilization reaches a certain desired threshold or until the system compresses all the incoming blocks with the better compression algorithm.

The following embodiments describe methods, devices, systems, and computer programs for dynamic adaptive compression in a network storage device. It will be apparent, that the present embodiments may be practiced without some or all of these specific details. In other instances, well-known process operations have not been described in detail in order not to unnecessarily obscure the present embodiments.

Figure 1A:
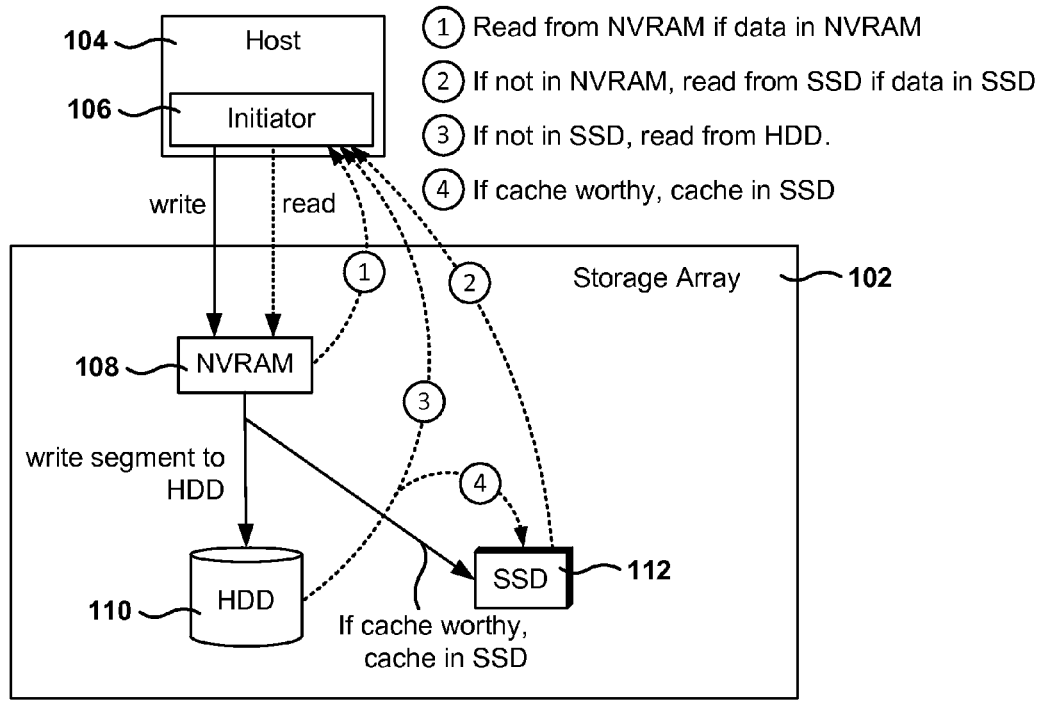
FIGS. 1A-1B illustrate the read and write paths within the storage array, according to several embodiments.
Figure 1B:
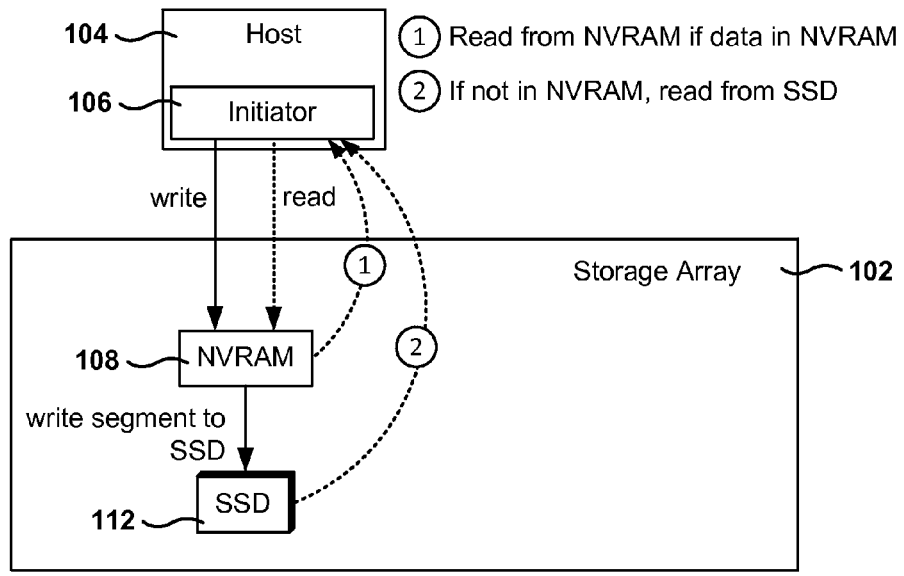

FIGS. 1A-1B illustrate the read and write paths within the storage array, according to several embodiments. FIG. 1A shows the write path for a hybrid system with SSDs and HDDs, where the initiator 106 in the host 104 sends the write request to the network storage device, also referred to herein as storage array 102. As used herein, the network storage device is referred to as a storage array, and the data within the storage array 102 is organized in volumes (e.g., a drive), where each volume is a single accessible storage area.

As the write data comes in, the write data is written into NVRAM 108, and an acknowledgment is sent back to the initiator (e.g., the host or application making the request). In one embodiment, storage array 102 supports variable block sizes. Data blocks in the NVRAM 108 are grouped together to form a segment that includes a plurality of data blocks, which may be of different sizes. The segment is compressed and then written to HDD 110. In addition, if the segment is considered to be cache-worthy (i.e., important enough to be cached or likely to be accessed again) the segment is also written to the solid state drive (SSD) cache 112, also referred to as flash cache. In one embodiment, the segment is written to the SSD cache 112 in parallel while writing the segment to HDD 110.

In one embodiment, the performance of the write path is driven by the flushing of NVRAM 108 to HDD 110. With regards to the read path, the initiator 106 sends a read request to storage array 102. The requested data may be found in any of the different levels of storage mediums of the storage array 102. First, a check is made to see if the data is found in RAM (not shown), which is a shadow memory of NVRAM 108, and if the data is found in RAM then the data is read from RAM and sent back to the initiator 106. In one embodiment, the shadow RAM memory (e.g., DRAM) keeps a copy of the data in the NVRAM and the read operations are served from the shadow RAM memory. When data is written to the NVRAM, the data is also written to the shadow RAM so the read operations can be served from the shadow RAM leaving the NVRAM free for processing write operations.

If the data is not found in the shadow RAM then a check is made to determine if the data is in cache, and if so (i.e., cache hit), the data is read from the SSD cache 112 and sent to the initiator 106. If the data is not found in the NVRAM 108 nor in the SSD cache 112, then the data is read from the hard disk drives 110 and sent to the initiator 106. In addition, if the data being served from hard disk drives 110 is cache worthy, then the data is also cached in the SSD cache 112.

FIG. 1B illustrates the read and write paths for an all-flash array having SSDs for permanent storage and no HDDs. The write path includes writing the incoming data to NVRAM 108 and later saving the data in SSD cache 112. The read path is also simplified as compared to the hybrid system of FIG. 1A, where the data is read from NVRAM 108 if available in NVRAM, and if the data is not found in NVRAM 108 then the data is read from SSD cache 112.

Figure 2:
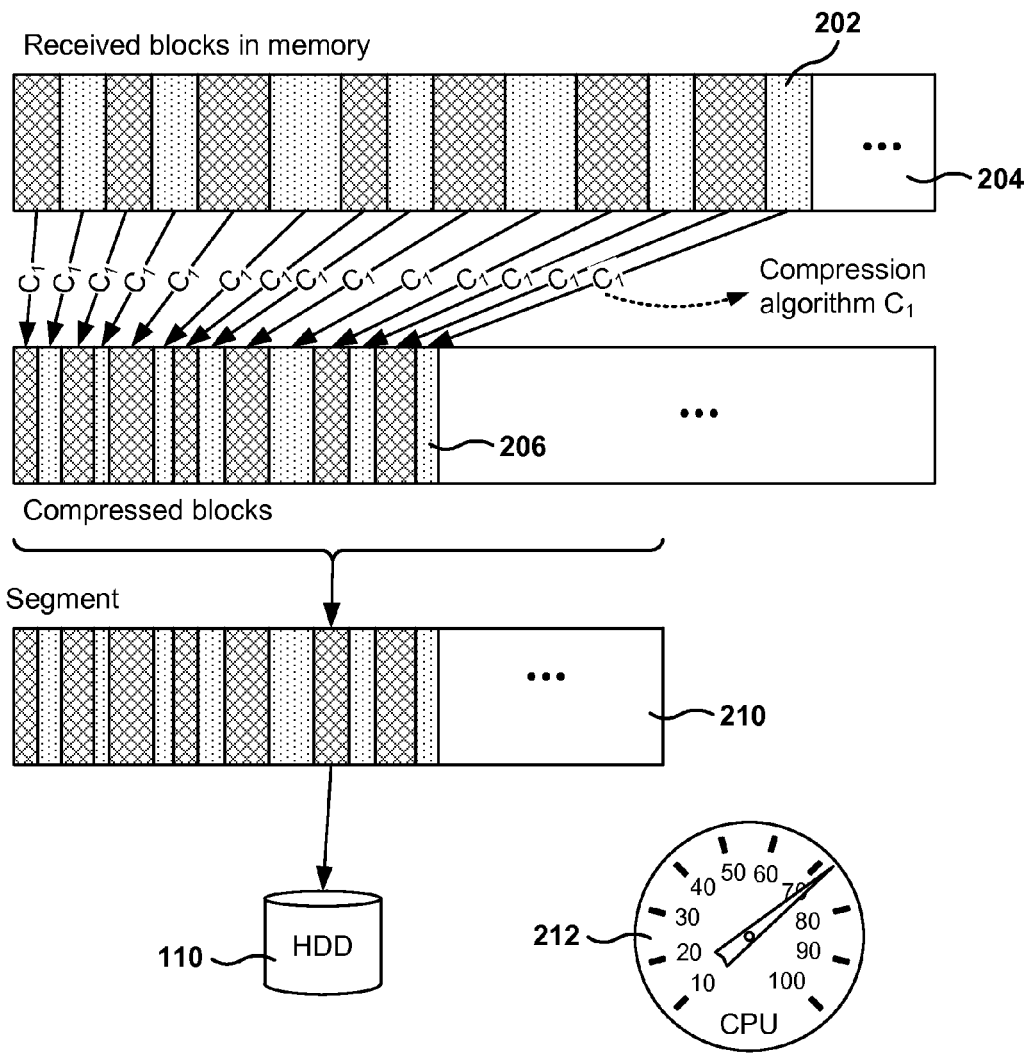
FIG. 2 illustrates the processing of incoming blocks, according to one embodiment.

FIG. 2 illustrates the processing of incoming blocks, according to one embodiment. As the data blocks 202 are received into the storage array, the received data blocks 202 are first stored in memory 204. If compression is being performed on the incoming blocks, a compression algorithm $C_1$ is utilized to compress the data blocks 202, resulting in compressed blocks 206.

In one embodiment, data is sent to disk in data units called segments, where each segment includes a plurality of data blocks. The data blocks within a segment do not need to have the same size although they can have the same size. The data blocks in the segment can have any size, as long as the data block fits within the segment. In one embodiment, a plurality of compressed blocks 206 is combined to form a segment 210, which is then sent to permanent storage, such as HDD 110. As used herein, permanent storage refers to the storage medium where data is to be stored permanently, such that the data stored in permanent storage is defined to remain in permanent storage if the storage array is powered off or rebooted. In one embodiment, HDD 110 is the permanent storage for the storage array. In an all-flash storage array, permanent storage includes the SSDs where the data is stored.

Data compression involves encoding data using fewer bits than in the original representation of the data. Lossless compression reduces bits by identifying and eliminating statistical redundancy, and no information is lost in lossless compression.

The design of data compression schemes involves trade-offs among various factors, including the degree of compression, and the computational resources required to compress and uncompress the data. Lossless data compression algorithms usually exploit statistical redundancy to represent data more concisely without losing information, so that the process is reversible. There are many compression algorithms to reduce file size by eliminating redundancy.

Some of the existing compression algorithms include the Lempel-Ziv (LZ) compression methods, DEFLATE (a variation on LZ optimized for decompression speed and compression ratio), and LZR (Lempel-Ziv-Renau) algorithm. DEFLATE is used in some common applications, such as PKZIP, Gzip and PNG. LZW (Lempel-Ziv-Welch) is used in GIF images. The LZR (Lempel-Ziv-Renau) algorithm is used for Zip method.

LZ methods use a table-based compression model where table entries are substituted for repeated strings of data. For most LZ methods, this table is generated dynamically from earlier data in the input. The table itself is often Huffman encoded (e.g. SHRI, LZX). A current LZ-based coding scheme is LZX, used in Microsoft's CAB format.

In a further refinement of the direct use of probabilistic modelling, statistical estimates can be coupled to an algorithm called arithmetic coding. Arithmetic coding is a more modern coding technique that uses the mathematical calculations of a finite-state machine to produce a string of encoded bits from a series of input data symbols. It can achieve superior compression to other techniques such as the better-known Huffman algorithm. An early example of the use of arithmetic coding was its use as an optional (but not widely used) feature of the JPEG image coding standard. It has since been applied in various other designs including H.264/MPEG-4 AVC and HEVC for video coding.

In one embodiment, the storage array monitors the CPU utilization rate 316, which is the amount of time the CPU is busy over a period of time divided by the period of time. The CPU utilization rate may be measured over different time periods, such as a 10th of a second, half a second, a second, or even longer periods of time, such as half a minute or a minute. The exemplary embodiment of FIG. 2 illustrates the CPU utilization rate in a dial (e.g., 72%).

Figure 3A:
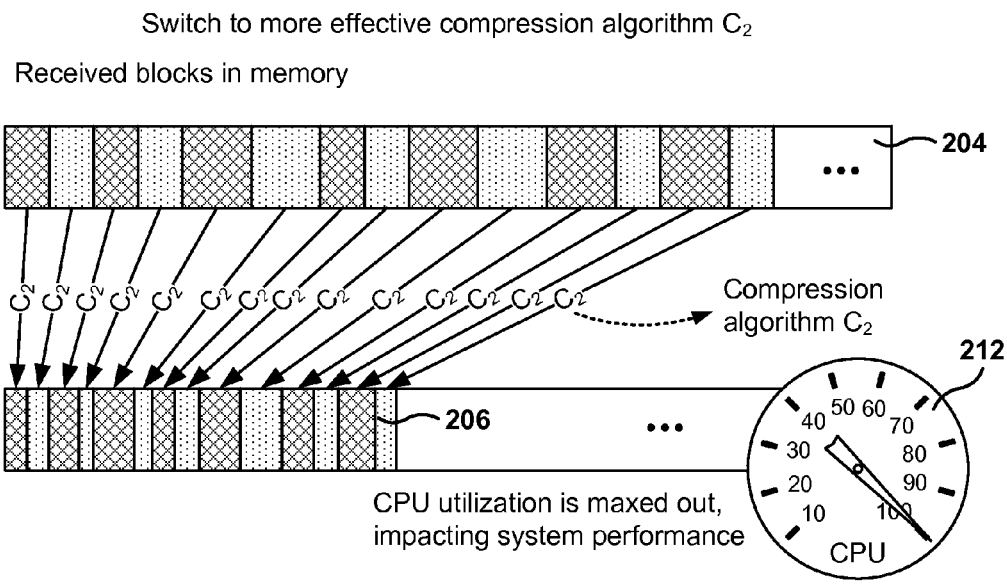
FIG. 3A illustrates the saturation of the CPU when utilizing a second compression algorithm, according to one embodiment.

FIG. 3A illustrates the saturation of the CPU when utilizing a second compression algorithm, according to one embodiment. There is a trade-off between compression speed and compression effectiveness for different compression algorithms. In general, a faster compression algorithm will result in a lower compression ratio than with a slower compression algorithm. Of course, if a compression algorithm is both slow and has a low compression ratio, that compression algorithm would not be chosen for compressing data.

In one embodiment, when there are free CPU cycles, e.g., CPU utilization is below a hundred percent or below a predefined threshold, the storage array starts compressing the incoming blocks utilizing a second compression algorithm $C_2$, which is slower than the previously-utilized compression algorithm $C_1$, but that provides a better compression rate. Since there are free CPU cycles, the storage array utilizes the free CPU cycles to better compress the data and to use less the space in disk.

In the scenario of FIG. 3A, compressing incoming blocks with $C_2$ utilizes more CPUs for compressing each of the blocks, resulting in a CPU utilization rate 212 of 100%. In other words, the system has maxed out the CPU utilization rate because of the change in compression algorithms (of course, assuming that all the conditions in the system remain stable and do not contribute to the increase or decrease in the CPU utilization rate).

Figure 3B:
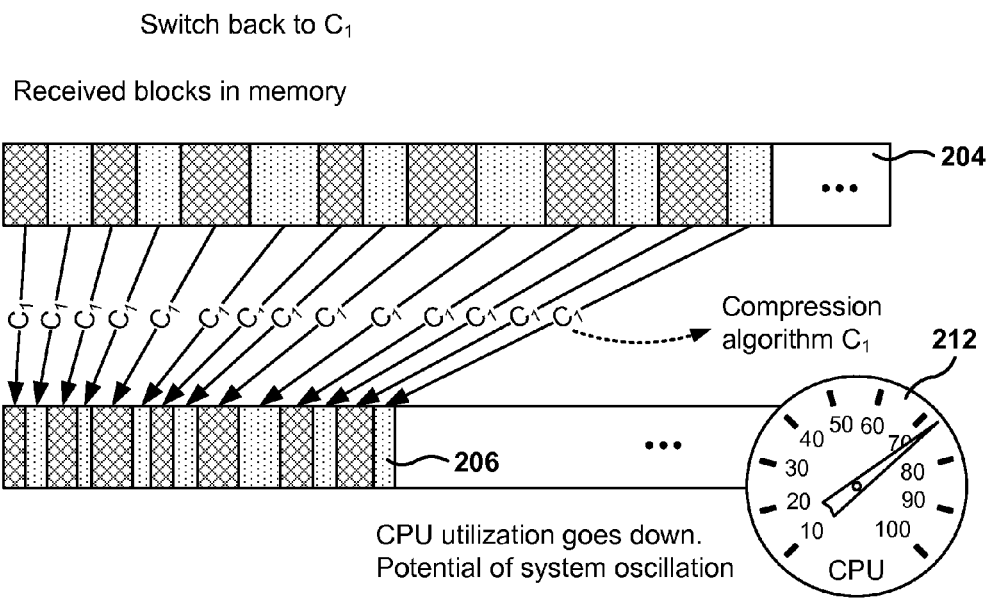
FIG. 3B illustrates a lower CPU utilization when utilizing a faster compression algorithm, in accordance with one embodiment.

Since the CPU utilization rate has maxed out, the performance of the storage array starts degrading, and the controller decides to switch back to the older compression algorithm, as shown in FIG. 3B.

FIG. 3B illustrates a lower CPU utilization when utilizing a faster compression algorithm, in accordance with one embodiment. Once the system returns to compressing with algorithm $C_1$, the CPU utilization rate 212 returns to a lower value (e.g., about 72% in this exemplary embodiment), which means that there are free CPU cycles again. However, if the system decides to return to the second algorithm $C_2$, the CPU will go back to the maximum utilization rate.

This changing back and forth between compression algorithms results in a system that oscillates between a relatively low CPU utilization and a maximum CPU utilization, and a system that oscillates will generally have low performance, because performance is driven by oscillating saturation points like a hurdle race. Expansion of new compression algorithm $C_2$ does not fit in given CPU utilization hence does not maintain an equilibrium condition.

Embodiments described herein present systems that can take advantage of free CPU cycles by gradually increasing the amount of blocks that are compressed with a more effective, but slower, compression algorithm while still compressing a percentage of blocks with the faster compression algorithm.

Figure 3C:
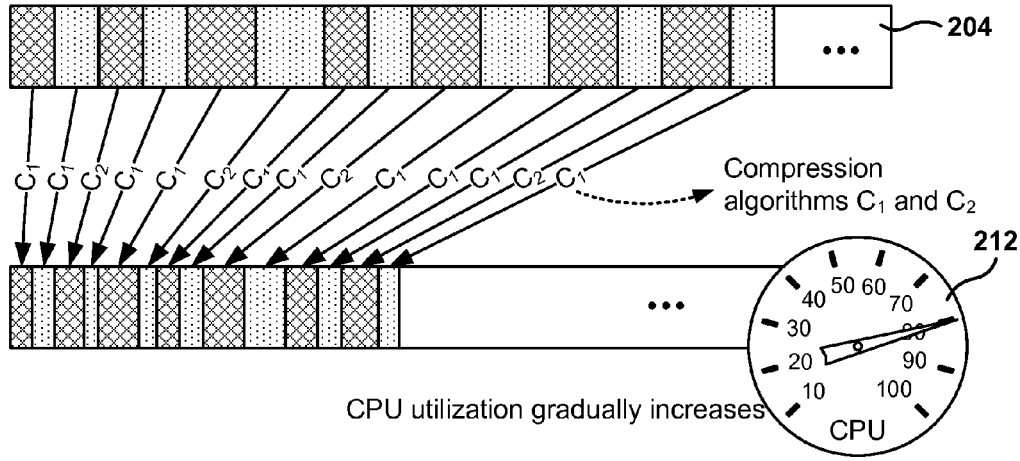
FIG. 3C illustrates the management of CPU utilization by using simultaneously two types of compression algorithms, according to one embodiment.

FIG. 3C illustrates the management of CPU utilization by using simultaneously two types of compression algorithms, according to one embodiment. In this embodiment, the system compresses a fraction of the incoming blocks with the first compression algorithm $C_1$ and the remainder incoming blocks with the second compression algorithm $C_2$.

The percentage of incoming blocks that are processed with $C_2$ does not change drastically, going from 0% to 100%, as illustrated in FIGS. 3A and 3B. Instead, the percentage of blocks processed with $C_2$ is gradually increased, as the CPU utilization rate is monitored. As long as there are free CPU cycles below a predetermined threshold amount, the percentage of blocks processed with $C_2$ is gradually increased (e.g., in 5% increments, although other increment values are also possible).

FIG. 3C illustrates a system with a mix of compression algorithms that are used simultaneously to compress the incoming blocks. As a result, the CPU utilization rate is gradually increased (e.g., to about 80%), which means that the system is stable and the CPU is not under pressure.

It's not always possible to utilize the best compression algorithm available, because the best compression algorithm available may take too many CPU cycles and overwhelm the system. On the other hand, if the fastest compression algorithm is always used, then compression ratio will be lower than if better algorithms are used.

If free CPU cycles are available, the system takes advantage of these free CPU cycles to compress some of the blocks with the better compression algorithm. Since the CPU cycles added were "free" because they were not being used, the overall system performance will not be impacted but the compression ratio will improve due to the use of the better compression algorithm, at least in some of the incoming blocks.

Figure 3D:
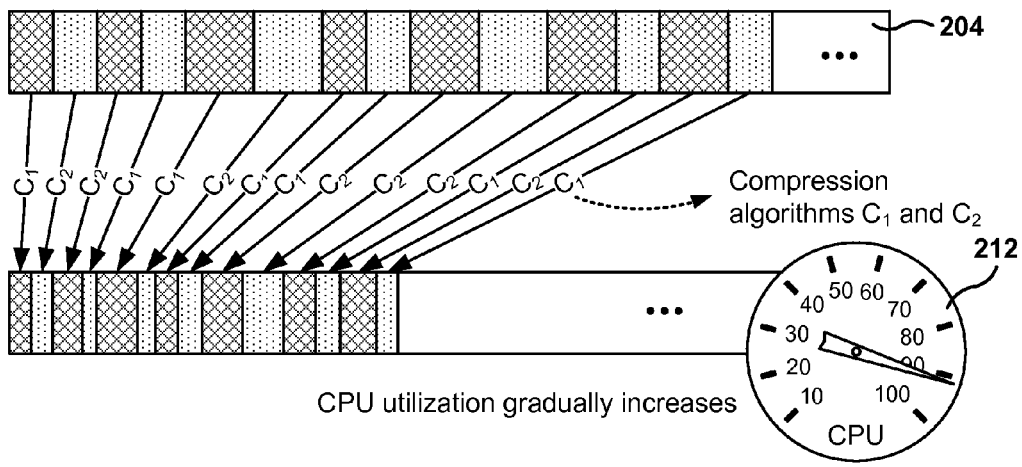
FIG. 3D illustrates the dynamic management of processor utilization by concurrently utilizing a plurality of compression algorithms, according to one embodiment.

FIG. 3D illustrates the dynamic management of processor utilization by concurrently utilizing a plurality of compression algorithms, according to one embodiment. As the percentage of blocks compressed with $C_2$ increases, the CPU utilization rate increases (e.g., 91%).

In one embodiment, the system creates a budget of CPU utilization for compressing data, and the goal is to keep the CPU utilization for compression at that budgeted value. However, if there are free CPU cycles, the system allows the compression system to use more CPU cycles than those allocated for compression. On the other hand, if the system is under resource pressure, the system may turn off compression temporarily for all or some of the incoming blocks.

The goal is to control the mix of compression algorithms in order to better utilize free CPU cycles and improve compression ratios. Another goal is to guarantee that compression doesn't tax the system too much so the overall system performance degrades.

Figure 4:
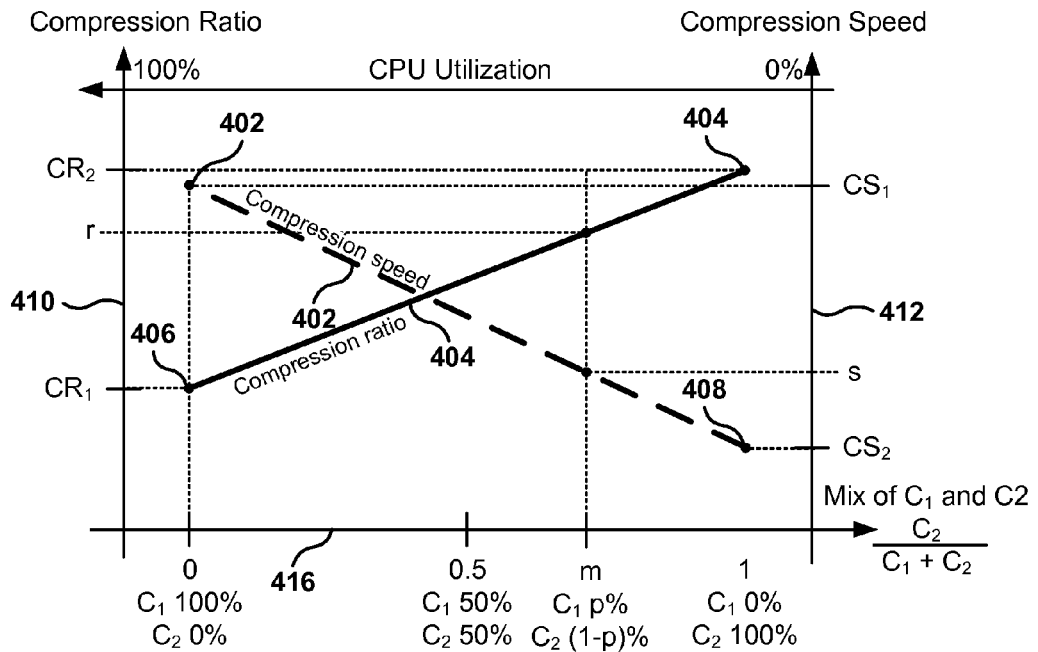
FIG. 4 is a chart illustrating the trade-offs between compression speed and compression ratio for the mix of two compression algorithms, according to one embodiment.

FIG. 4 is a chart illustrating the trade-offs between compression speed and compression ratio for the mix of two compression algorithms, according to one embodiment. The horizontal axis 416 represents the mix between the two compression algorithms, and is defined as the number of blocks compress utilizing $C_2$ divided by the total number of blocks compressed using $C_1$ and $C_2$, which is referred to as $$\frac{C_2}{C_1 + C_2}.$$

Therefore, at the left of the chart all blocks are being compressed with $C_1$, and at the right of the chart all blocks are compressed utilizing $C_2$.

There are two vertical axes: a first axis on the left for the compression ratio (CR) 410, and a second axis on the right for the compression speed (CS) 412. $CR_1$ 406 is the compression rate for $C_1$, $CR_2$ 404 is the compression rate for $C_2$, $CS_1$ 402 is the compression speed for $C_1$, and $CS_2$ 408 is the compression rate for $C_2$. Therefore, when the system is processing all blocks with $C_1$, the system compression speed will be $CS_1$ and the system compression ratio will be $CR_1$. On the other end, when the system is processing all blocks with $C_2$, the system compression speed will be $CS_2$ and the system compression ratio will be $CR_2$.

When there is a mix of blocks compressed with $C_1$ and $C_2$, the compression ratio will vary between $CR_1$ and $CR_2$, and the compression speed will vary between $CS_1$ and $CS_2$. FIG. 4 illustrates how the compression ratio changes between CR1 and CR2 depending on the mix of compression algorithms, and how the compression speed varies between $CS_1$ and $CS_2$. The embodiment of FIG. 4 shows a linear variation for the ratio and the speed changes, but other types of rate changes are also possible.

Instead of having a binary switch where the system processes all incoming blocks with one compression algorithm or the other one, the system gradually changes the percentage of blocks processed with the different algorithms based on the CPU utilization rate. When the CPU utilization rate is low, the system gradually changes to have some of the blocks to be compressed with the slowest, but more effective, compression algorithm, and vice versa.

Going from left to right on horizontal axis 416, the system increases the percentage of blocks processed with $C_2$. Therefore, as $C_2$ is increased in the mix, the compression rate 404 goes up while the compression speed 402 goes down. This gradual change in the mix of compression algorithms used is referred to herein as dynamic adaptive compression or continuously adaptive compression.

At any point, the system may be operating at some mix of blocks processed with $C_1$ and the rest processed with $C_2$. If there is more CPU available then the number of blocks processed with $C_2$ is gradually increased. This change in the percentage of blocks compressed with $C_2$ is performed gradually to avoid oscillation in the system. At some point, a threshold CPU utilization may be reached, and the system will start increasing the percentage of blocks being compressed with $C_1$ to spend less CPU cycles compressing. More details are provided below with reference to FIG. 5 that illustrates the use of thresholds for dynamic adaptive compression.

The gradual change in the mix of compression algorithms avoids oscillation and guarantees smooth CPU utilization changes. Another benefit of utilizing a mix of compression algorithms simultaneously is that it is possible to track, in real time, the compression speeds and ratios for both compression algorithms. Depending on the results, the system may adjust the mix, or even switch to a different compression algorithm if one of the compression algorithms is not providing the desired performance.

For example, if for a certain type of data $C_2$ is not providing better compression that $C_1$, the system may temporarily hold the use of $C_2$ since it is using more CPU but providing no improvement in the compression ratio.

Figure 5:
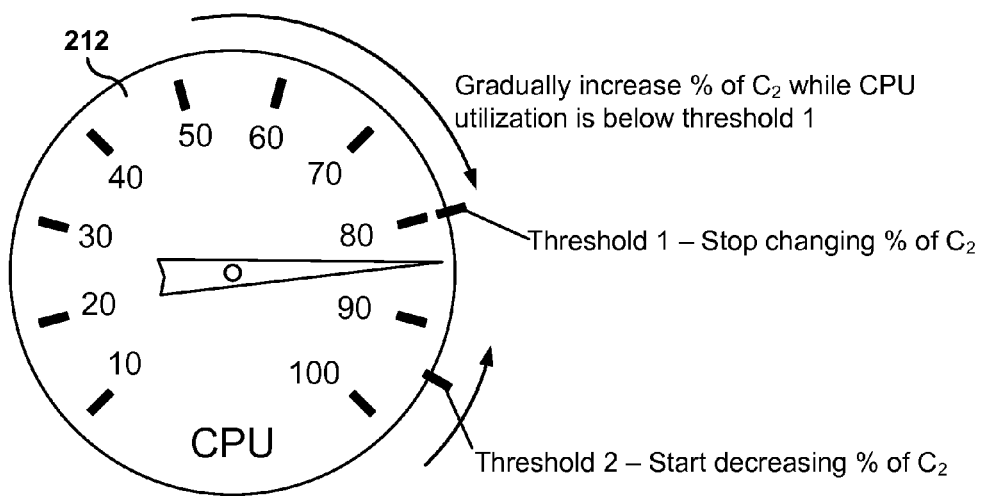
FIG. 5 illustrates the thresholds defined for processor utilization when using dynamic allocation of compression algorithms, according to one embodiment.

FIG. 5 illustrates the thresholds defined for processor utilization when using dynamic allocation of compression algorithms, according to one embodiment. In one embodiment, CPU utilization thresholds are defined to adjust when the changes in the algorithm mix are performed, in order to avoid too many changes in the compression policy or saturating the CPU.

In one embodiment, a first threshold is defined (e.g., at 90% CPU utilization) and as long as the CPU utilization rate is below the first threshold, the controller gradually increases the percentage of blocks that are processed utilizing $C_2$. For example, the controller may increase the percentage of blocks compressed with $C_2$ every second by 5%, but other time periods and other increments are also possible. The percentage of $C_2$ will periodically be increased until all blocks are compressed utilizing $C_2$ or until the CPU utilization rate reaches a second threshold (e.g., 95%), associated with a higher CPU utilization rate than the first threshold.

When the CPU utilization rate reaches $C_2$, the controller starts decreasing gradually the percentage of blocks processed with $C_2$, i.e., increasing the percentage of blocks processed with $C_1$. In one embodiment, the controller may also perform non-gradual changes to the percentage of blocks processed with $C_2$. For example, if the system suddenly becomes very busy, the controller may suddenly change the percentage of blocks processed with $C_2$ to be zero, i.e., all the blocks will be compressed with $C_1$. This quick change may free resources quickly so the controller can respond to changing conditions in the system, such as a sudden burst of incoming blocks. When the CPU start having free cycles, the controller will then start compression of blocks with $C_2$ again, gradually increasing the percentage of blocks processed with $C_2$.

This means that the system will gradually change the percentage of blocks processed with the different compression algorithms in order to take advantage of the free CPU cycles, without causing oscillation in the system, but the system is also able to quickly react to changing conditions by shifting completely to the compression algorithm that requires less CPU.

It is noted that the embodiment illustrated in FIG. 5 is exemplary. Other embodiments may utilize different thresholds values, identify additional thresholds to avoid continuous changes in the mix of compression algorithms, etc. The embodiment illustrated in FIG. 5 should therefore not be interpreted to be exclusive or limiting, but rather exemplary or illustrative.

It is noted that, generally, decompression is much faster than compression. In one embodiment, the compression speed may also be taken into account when selecting the compression algorithm, but in other embodiments the decompression speed is not a factor when selecting the compression algorithm. Decompression is important because decompression takes place when the data is read, and generally, data is read more times than it is written. However, decompression is sometimes not considered, because the system is aiming at taking advantage of free CPU cycles to improve the compression ratio. Even if the benefit in the increase of the decompression ratio is small, it is still a benefit because the system is using free CPU cycles to perform better compression.

Figure 6:
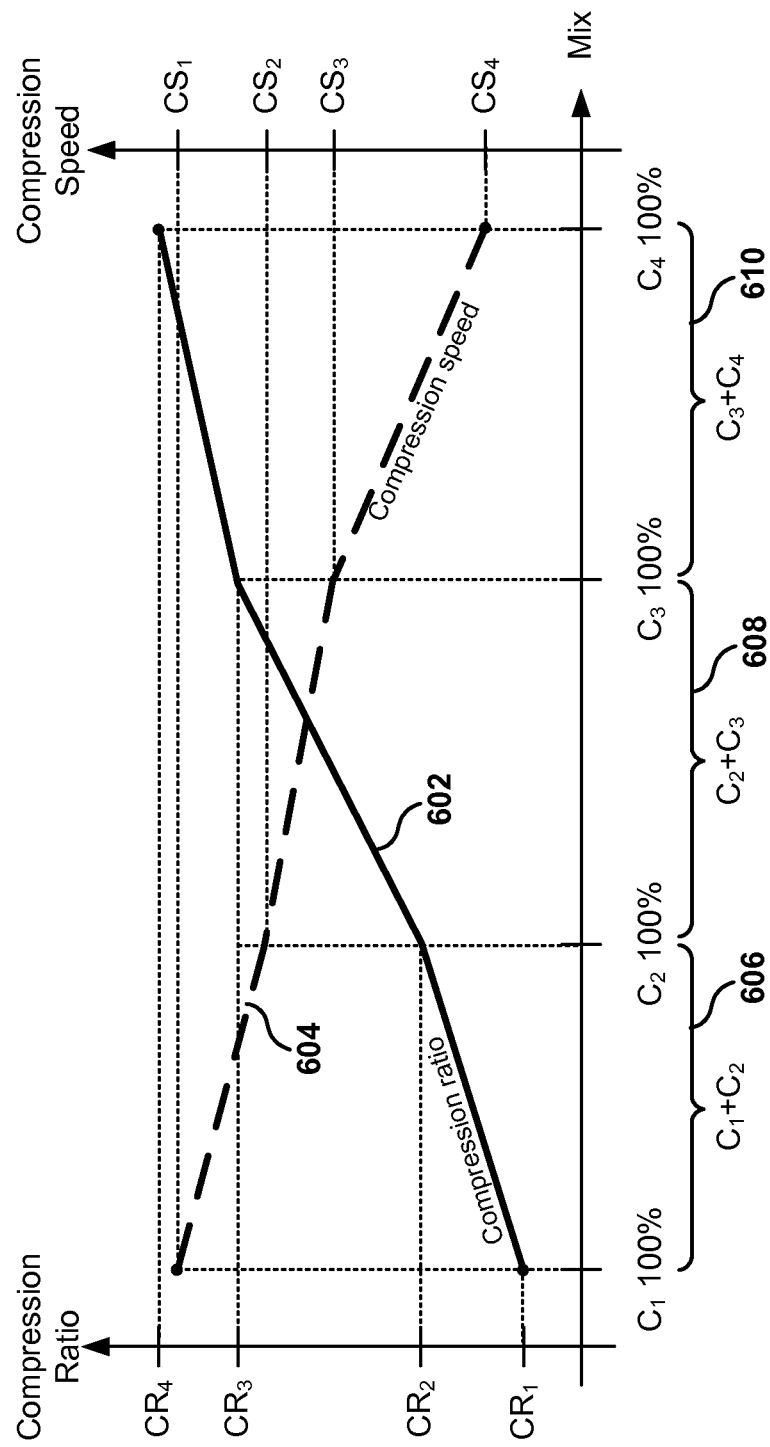
FIG. 6 is a chart illustrating the use of more than two compression algorithms based on processor utilization, according to one embodiment.

FIG. 6 is a chart illustrating the use of more than two compression algorithms based on processor utilization, according to one embodiment. The chart in FIG. 6 similar to the chart in FIG. 4, except that four different compression algorithms are utilized by the system: $C_1$, $C_2$, $C_3$, and $C_4$, where $C_1$ is faster than $C_2$, which is faster than $C_3$, which is faster than $C_4$, and $C_4$ has a better compression rate than $C_3$, which has a better compression rate than $C_2$, which has a better compression rate than $C_1$. A different mix is utilized depending on the CPU utilization rate.

In the embodiment of FIG. 6, at any point in time, the system utilizes one or two compression algorithms simultaneously. In other embodiments, it is possible that the system may utilize simultaneously three or more compression algorithms for the incoming blocks. For example, the system may set a threshold in which $C_1$ will always be used in at least 10% of the incoming blocks and, when C3 is being used, the system will also reserve at least 10% of the incoming blocks to be processed with $C_2$.

In the exemplary embodiment of FIG. 6, the system initially compresses blocks utilizing $C_1$, and if there are free CPU cycles, the system starts utilizing $C_2$, gradually increasing the percentage of blocks compressed with $C_2$, as long as there are free CPU cycles below a predefined threshold CPU utilization rate. At this first stage 606, there is a mix of blocks that are compressed with $C_1$ or $C_2$.

As long as there are free CPU cycles, the percentage of blocks compressed with $C_2$ is increased until all blocks are compressed with $C_2$. At this point, a second stage 608 is started utilizing compression algorithms $C_2$ and $C_3$. As long as there are free CPU cycles, the percentage of blocks compressed with $C_3$ is increased, until all blocks are compressed with $C_3$. In third stage 608, as long as there are free CPU cycles, a new mix is started with algorithms $C_3$ and $C_4$, and the system will increase the percentage of blocks compressed with $C_4$ until all blocks are compressed with $C_4$.

The reverse process is similar, when there is pressure on the CPU, the system will start increasing the percentage of blocks compressed with $C_3$, then $C_2$, and then $C_1$, until all blocks are compressed with $C_1$. Other embodiments may utilize a different number of compression algorithms, such as three, five, or even more compression algorithms.

Figure 7:
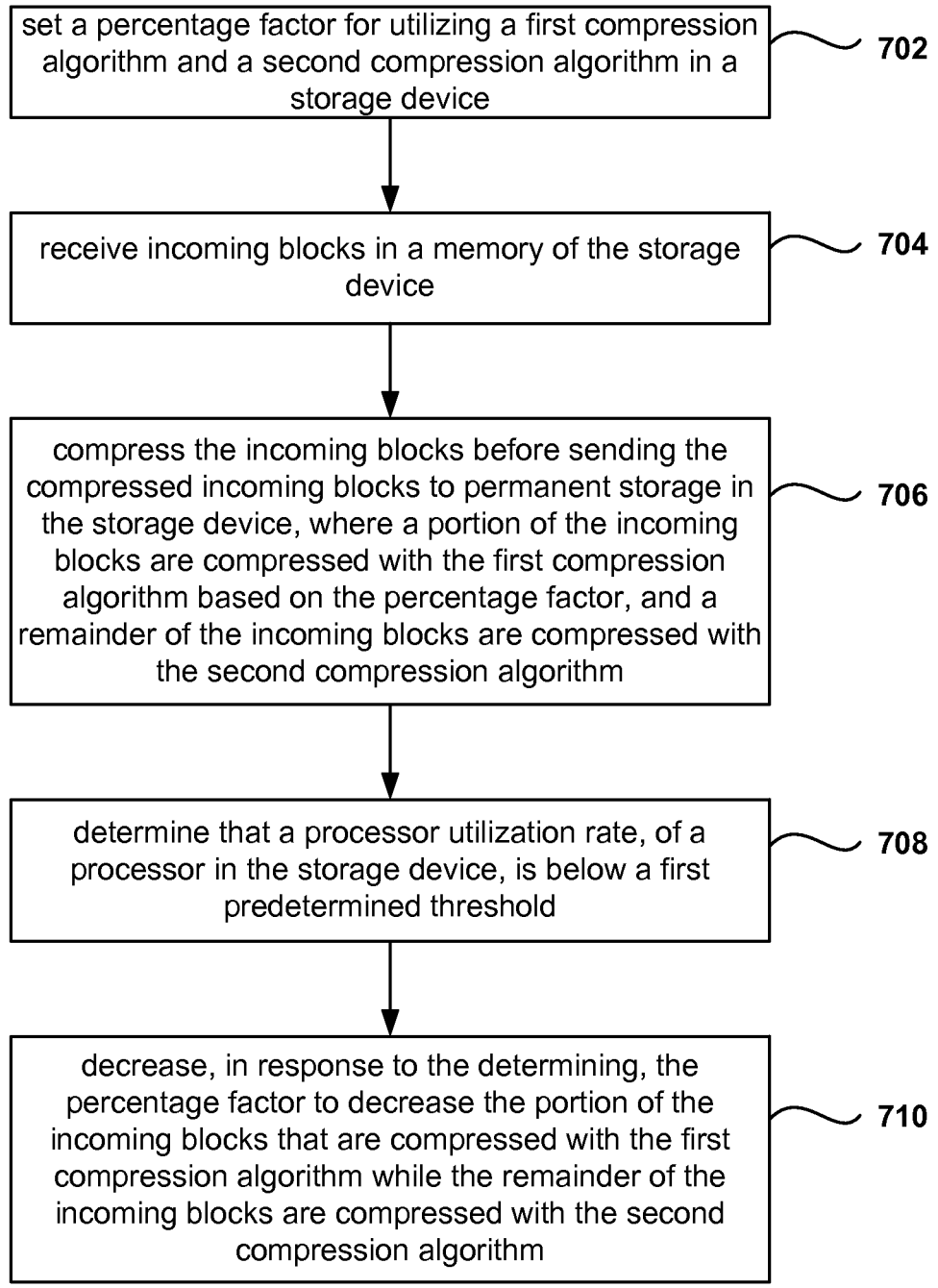
FIG. 7 is a flowchart for dynamic adaptive compression in a network storage device, according to one embodiment.

FIG. 7 is a flowchart for dynamic adaptive compression in a network storage device, according to one embodiment. While the various operations in this flowchart are presented and described sequentially, one of ordinary skill will appreciate that some or all of the operations may be executed in a different order, be combined or omitted, or be executed in parallel.

In operation 702, a percentage factor is set for utilizing a first compression algorithm and a second compression algorithm in a storage device. From operation 702, the method flows to operation 704 for receiving incoming blocks in a memory of the storage device.

From operation 704, the method flows to operation 706 where the incoming blocks are compressed before sending the compressed incoming blocks to permanent storage in the storage device. A portion of the incoming blocks are compressed with the first compression algorithm based on the percentage factor, and the remainder of the incoming blocks is compressed with the second compression algorithm. In one embodiment, the number of incoming blocks compressed with the first compression algorithm over a predetermined period of time is equal to the percentage factor times a total number of incoming blocks compressed over the predetermined period of time, and the number of incoming blocks compressed with the second compression algorithm over the predetermined period of time is equal to the total number of incoming blocks compressed over the predetermined period of time minus the number of incoming blocks compressed with the first compression algorithm over the predetermined period of time. In one embodiment, the storage arrays support variable block sizes for different volumes. For example, incoming blocks could be a mix of 4 KB, 8 KB, 16 KB and 32 KB sized blocks, etc. In one embodiment, to perform the percentage calculation, the size of the incoming blocks is converted into units of 4 KB blocks, which simplifies calculations. For example, a 16 KB sized block is considered equivalent to 4 blocks of 4 KB and 32 KB block as 8 blocks.

From operation 706, the method flows to operation 708 for determining that a processor utilization rate, of the processor in the storage device, is below a first predetermined threshold. From operation 708, the method flows to operation 710 for decreasing, in response to the determining, the percentage factor to decrease the portion of the incoming blocks that are compressed with the first compression algorithm while the remainder of the incoming blocks are compressed with the second compression algorithm.

In one embodiment, compression of the incoming blocks may be turned on or off per volume. Therefore, some volumes may not be compressed at all, while other volumes may have their incoming blocks compressed before being stored in permanent storage. Further, in one embodiment, the compression ratio is tracked on a per-volume basis, as well as the average compression ratio for a period of time (e.g., 5 seconds).

Figure 8:
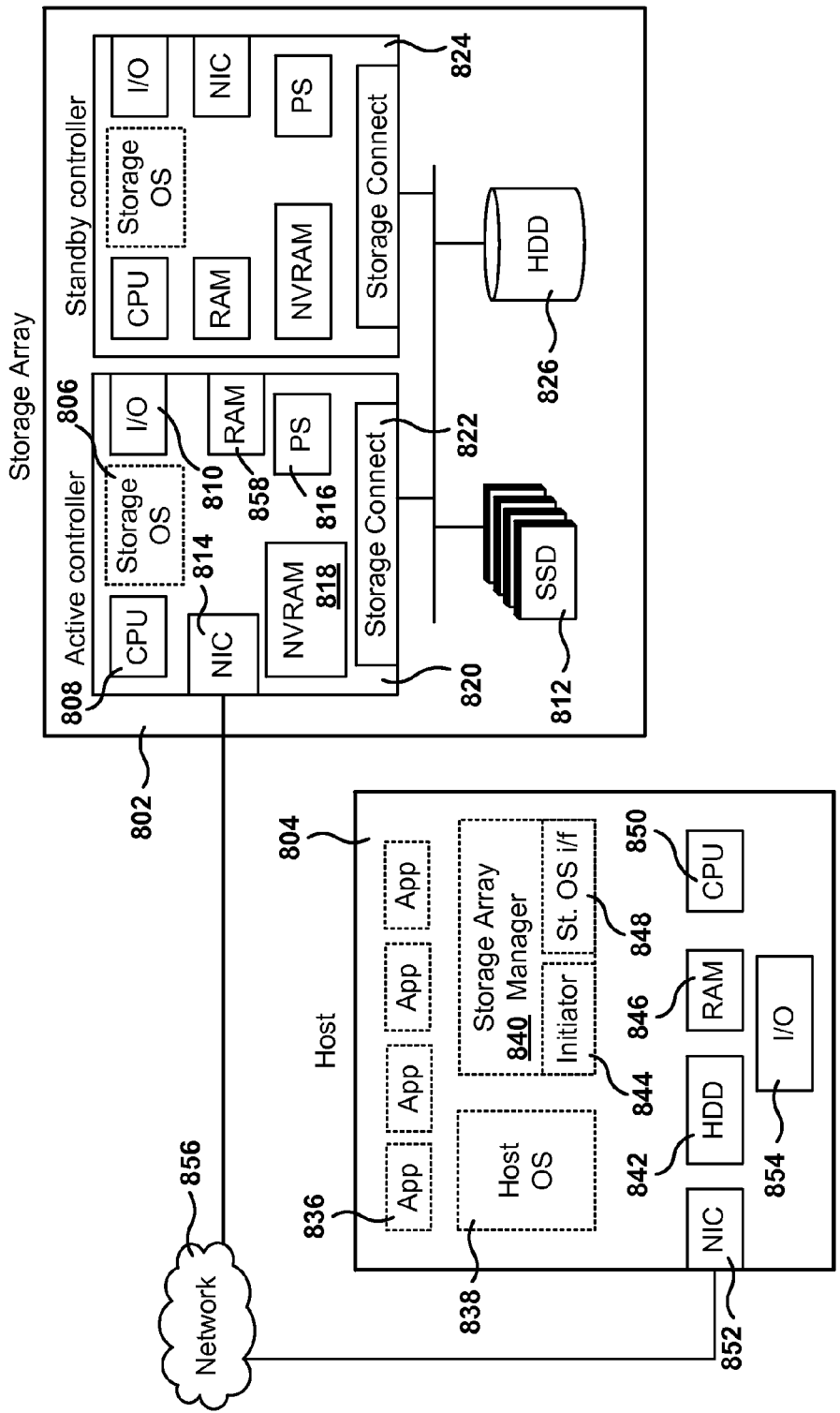
FIG. 8 illustrates the architecture of a storage array, according to one embodiment.

FIG. 8 illustrates the architecture of a storage array, according to one embodiment. In one embodiment, the storage array 802 includes an active controller 820, a standby controller 824, one or more SSDs 812, and disk storage 826. In one embodiment, the active controller 820 includes non-volatile RAM (NVRAM) 818, which is for storing the incoming data as the data arrives to the storage array. After the data is processed (e.g., compressed and organized in segments (e.g., coalesced)), the data is transferred from the NVRAM 818 to disk storage 826 and optionally to SSD 812.

In addition, the active controller 820 further includes CPU 808, general-purpose RAM 858 (e.g., used by the programs executing in CPU 808), input/output module 810 for communicating with external devices (e.g., USB port, terminal port, connectors, plugs, links, etc.), one or more network interface cards (NICs) 814 for exchanging data packages through network 856, one or more power supplies 816, a temperature sensor (not shown), and a storage connect module 822 for sending and receiving data to and from SSD 812. In one embodiment, standby controller 824 includes the same components as active controller 820.

Active controller 820 is configured to execute one or more computer programs stored in RAM 858. One of the computer programs is the storage operating system (OS) used to perform operating system functions for the active controller device. In some implementations, one or more expansion shelves may be coupled to storage array 802 to increase storage capacity.

Active controller 820 and standby controller 824 have their own NVRAMs, but they share SSDs 812. The standby controller 824 receives copies of what gets stored in the NVRAM 818 of the active controller 820 and stores the copies in its own NVRAM. If the active controller 820 fails, standby controller 824 takes over the management of the storage array 802. When servers, also referred to herein as hosts, connect to the storage array 802, read/write requests (e.g., IO requests) are sent over network 856, and the storage array 802 stores the sent data or sends back the requested data to host 804.

Host 804 is a computing device including a CPU 850, memory (RAM) 846, permanent storage (HDD) 842, a NIC card 852, and an IO module 854. The host 804 includes one or more applications 836 executing on CPU 850, a host operating system 838, and a computer program for a storage array manager 840 that provides an interface for accessing storage array 802 to applications 836. Storage array manager 840 includes an initiator 844 and a storage OS interface program 848. When an IO operation is requested by one of the applications 836, the initiator 844 establishes a connection with storage array 802 in one of the supported formats (e.g., iSCSI, Fibre Channel, or any other protocol). The storage OS interface program 848 provides console capabilities for managing the storage array 802 by communicating with the active controller 820 and the storage OS 806 executing therein.

To process the IO requests, resources from the storage array 802 are required. Some of these resources may be a bottleneck in the processing of storage requests because the resources are over utilized, or are slow, or for any other reason. In general, the CPU and the hard drives of the storage array 802 can become over utilized and become performance bottlenecks. For example, the CPU may become very busy because the CPU is utilized for processing storage IO requests while also performing background tasks, such as garbage collection, snapshots, replication, alert reporting, etc. In one example, if there are many cache hits (i.e., the SSD contains the requested data during IO requests), the SSD cache, which is a fast responding system, may press the CPU for cycles, thus causing potential bottlenecks for other requested IOs or for processing background operations.

For purposes of discussion and understanding, reference is made to CASL as being an algorithm processed by the storage OS. However, it should be understood that optimizations, modifications, additions, and subtractions to versions of CASL may take place from time to time. As such, reference to CASL should be understood to represent exemplary functionality, and the functionality may change from time to time, and may be modified to include or exclude features referenced herein or incorporated by reference herein. Still further, it should be understood that the embodiments described herein are just examples, and many more examples and/or implementations may be defined by combining elements and/or omitting elements described with reference to the claimed features.

In one embodiment, it should be understood that the "block level processing" of SSDs 812 is different than "instruction level processing," which is a common function in microprocessor environments. In one example, microprocessor environments utilize main memory, and various levels of cache memory (e.g., L1, L2, etc.). Instruction level caching, is differentiated further, because instruction level caching is block-agnostic, meaning that instruction level caching is not aware of what type of application is producing or requesting the data processed by the microprocessor. Generally speaking, the microprocessor is required to treat all instruction level caching equally, without discriminating or differentiating processing of different types of applications.

One or more embodiments can also be fabricated as computer readable code on a non-transitory computer readable storage medium. The non-transitory computer readable storage medium is any non-transitory data storage device that can store data, which can be read later by a computer system. Examples of the non-transitory computer readable storage medium include hard drives, network attached storage (NAS), read-only memory, random-access memory, CD-ROMs, CD-Rs, CD-RWs, magnetic tapes, and other optical and non-optical data storage devices. The non-transitory computer readable storage medium can include computer readable storage medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the described embodiments.

What is claimed is:

1. A method comprising:
setting a percentage factor for utilizing a first compression algorithm and a second compression algorithm in a storage device;
receiving incoming blocks in a memory of the storage device;
compressing the incoming blocks before sending the compressed incoming blocks to permanent storage in the storage device, wherein a portion of the incoming blocks are compressed with the first compression algorithm based on the percentage factor, and a remainder of the incoming blocks is compressed with the second compression algorithm;
determining that a processor utilization rate, of a processor in the storage device, is below a first predetermined threshold; and
decreasing, in response to the determining, the percentage factor to decrease the portion of the incoming blocks that are compressed with the first compression algorithm while the remainder of the incoming blocks is compressed with the second compression algorithm.

2. The method as recited in claim 1, wherein a number of incoming blocks compressed with the first compression algorithm over a predetermined period of time is equal to the percentage factor times a total number of incoming blocks compressed over the predetermined period of time, wherein a number of incoming blocks compressed with the second compression algorithm over the predetermined period of time is equal to the total number of incoming blocks compressed over the predetermined period of time minus the number of incoming blocks compressed with the first compression algorithm over the predetermined period of time.

3. The method as recited in claim 1, wherein the percentage factor is adjustable to be any percentage value between zero percent and one hundred percent.

4. The method as recited in claim 1, further comprising:
re-determining, after decreasing the percentage factor, that the processor utilization rate is still below the first predetermined threshold; and
continue decreasing, in response to the re-determining, the percentage factor while the percentage factor is greater than zero.

5. The method as recited in claim 1, further comprising:
determining that the processor utilization rate is above a second predetermined threshold; and
increasing the percentage factor when the processor utilization rate is above the second predetermined threshold.

6. The method as recited in claim 1, wherein the first algorithm performs compression faster than the second algorithm, wherein the second algorithm is more effective at compressing than the first algorithm.

7. The method as recited in claim 1, wherein the processor is in a controller in the storage device, wherein the processor is utilized for processing the incoming blocks received at the storage device.

8. The method as recited in claim 1, further comprising:
grouping a plurality of compressed blocks into a segment; and
storing the segment in the permanent storage.

9. The method as recited in claim 1, wherein the incoming blocks belong to one or more volumes, wherein blocks within a volume are compressible utilizing the first algorithm and are compressible utilizing the second algorithm.

10. A storage device comprising:
a memory for storing incoming blocks received at a storage device;
permanent storage; and
a processor configured to set a percentage factor for utilizing a first compression algorithm and a second compression algorithm in the storage device, wherein the incoming blocks are compressed before the compressed incoming blocks are sent to the permanent storage, wherein a portion of the incoming blocks are compressed with the first compression algorithm based on the percentage factor, and a remainder of the incoming blocks is compressed with the second compression algorithm;
wherein the processor is configured to decrease, when a processor utilization rate of the processor is below a first predetermined threshold, the percentage factor to decrease the portion of the incoming blocks that are compressed with the first compression algorithm while the remainder of the incoming blocks is compressed with the second compression algorithm.

11. The storage device as recited in claim 10, wherein a number of incoming blocks compressed with the first compression algorithm over a predetermined period of time is equal to the percentage factor times a total number of incoming blocks compressed over the predetermined period of time, wherein a number of incoming blocks compressed with the second compression algorithm over the predetermined period of time is equal to the total number of incoming blocks compressed over the predetermined period of time minus the number of incoming blocks compressed with the first compression algorithm over the predetermined period of time.

12. The storage device as recited in claim 10, wherein the percentage factor is adjustable to be any percentage value between zero percent and one hundred percent.

13. The storage device as recited in claim 10, wherein the processor is configured to determine, after decreasing the percentage factor, that the processor utilization rate is still below the first predetermined threshold, and continue decreasing, in response to the re-determining, the percentage factor while the percentage factor is greater than zero.

14. The storage device as recited in claim 10, wherein the processor is configured to determine that the processor utilization rate is above a second predetermined threshold, and increase the percentage factor when the processor utilization rate is above the second predetermined threshold.

15. The storage device as recited in claim 10, wherein the first algorithm performs compression faster than the second algorithm, wherein the second algorithm is more effective at compressing than the first algorithm.

16. A non-transitory computer-readable storage medium storing a computer program for processing data in a storage device, the computer-readable storage medium comprising:
    program instructions for setting a percentage factor for utilizing a first compression algorithm and a second compression algorithm in a storage device;
    program instructions for receiving incoming blocks in a memory of the storage device;
    program instructions for compressing the incoming blocks before sending the compressed incoming blocks to permanent storage in the storage device, wherein a portion of the incoming blocks are compressed with the first compression algorithm based on the percentage factor, and a remainder of the incoming blocks is compressed with the second compression algorithm;
    program instructions for determining that a processor utilization rate, of a processor in the storage device, is below a first predetermined threshold; and
    program instructions for decreasing, in response to the determining, the percentage factor to decrease the portion of the incoming blocks that are compressed with the first compression algorithm while the remainder of the incoming blocks is compressed with the second compression algorithm.

17. The storage medium as recited in claim 16, wherein the percentage factor is adjustable to be any percentage value between zero percent and one hundred percent.

18. The storage medium as recited in claim 16, further comprising:
    program instructions for re-determining, after decreasing the percentage factor, that the processor utilization rate is still below the first predetermined threshold; and
    program instructions for continue decreasing, in response to the re-determining, the percentage factor while the percentage factor is greater than zero.

19. The storage medium as recited in claim 16, further comprising:
    program instructions for determining that the processor utilization rate is above a second predetermined threshold; and
    program instructions for increasing the percentage factor when the processor utilization rate is above the second predetermined threshold.

20. The storage medium as recited in claim 16, wherein the first algorithm performs compression faster than the second algorithm, wherein the second algorithm is more effective at compressing than the first algorithm.

* * * * *